US005335283A

United States Patent [19]

Torii

[11] Patent Number: 5,335,283

[45] Date of Patent: Aug. 2, 1994

[54] LOUDSPEAKER APPARATUS FOR ELECTRONIC KEYBOARD MUSICAL INSTRUMENT

[75] Inventor: Katsuhiko Torii, Hamamatsu, Japan

[73] Assignee: Kabushiki Kaisha Kawai Gakki Seisakusho, Hamamatsu, Japan

[21] Appl. No.: 975,336

[22] Filed: Nov. 16, 1992

[30] Foreign Application Priority Data

Mar. 24, 1992 [JP] Japan .................................... 4-15309

[51] Int. Cl.[5] .......................... G10H 1/00; H05K 5/00

[52] U.S. Cl. .................................... 381/118; 381/159; 381/88; 84/719; 84/744; 181/145; 181/199

[58] Field of Search .................. 84/DIG. 1, DIG. 27, 84/644, 670, 718, 719, 743, 744; 181/144, 145, 148, 152, 157, 159, 160, 199; 381/118, 90, 88, 87, 159, 156, 153, 188, 205

[56] References Cited

U.S. PATENT DOCUMENTS 4,524,846 6/1985 Whitby ................................ 181/159
5,086,686 2/1992 Misawa et al. ...................... 181/144

FOREIGN PATENT DOCUMENTS 0158800 6/1990 Japan ..................................... 84/644
4017497 1/1992 Japan .................................. 381/159

*Primary Examiner*—Curtis Kuntz
*Assistant Examiner*—P. W. Lee
*Attorney, Agent, or Firm*—Armstrong, Westerman, Hattori, McLeland & Naughton

[57] ABSTRACT

A loudspeaker apparatus for an electronic keyboard musical instrument has a shelf board constituting a casing of the musical instrument. The shelf board has a sound emission opening and a first port. A loudspeaker is mounted on an upper side of the shelf board in alignment with a fringe of the sound emission opening. A first speaker box is mounted on the upper side of the shelf board so as to enclose the loudspeaker and the first port. A second speaker box is mounted on a lower side of the shelf board in fluid communication with the first speaker box via the first port. The second speaker box has a second port.

9 Claims, 3 Drawing Sheets

LOUDSPEAKER APPARATUS FOR ELECTRONIC KEYBOARD MUSICAL INSTRUMENT

BACKGROUND OF THE INVENTION

The present invention relates to a loudspeaker apparatus for an electronic keyboard musical instrument such as an electronic piano or the like.

As a loudspeaker apparatus for such an electronic keyboard musical instrument, there is conventionally known such a one as shown in FIG. 4(A) and FIG. 4(B). In this apparatus, a pair of right and left sound emission openings b, b are provided in a shelf board "a" of a casing f of the musical instrument. Each of loudspeakers c, c which are responsive to lower acoustic frequencies (e.g., woofers) is mounted on the shelf board "a" in alignment with the respective fringe of the sound emission openings b, b. Each of loudspeakers d, d which are responsive to higher acoustic frequencies (e.g., tweeters) is mounted on the shelf board "a" in close proximity to the loudspeakers c, c. Further, as shown in FIG. 5(A) and FIG. 5(B), there is known another loudspeaker apparatus in which speaker boxes e, e, each containing therein a loudspeaker c which is responsive to lower acoustic frequencies and a loudspeaker d which is responsive to higher acoustic frequencies, are mounted on the right and the left sides of the shelf board "a."

The speaker apparatus shown in FIG. 4(A) and FIG. 4(B) has a disadvantage in that, because there is no speaker box, the low-frequency range characteristics are poor. In the speaker apparatus shown in FIG. 5(A) and FIG. 5(B), since the speakers c, d are provided inside the casing f of the musical instrument, the sounds emitted from the speakers c, d interfere with each other within the casing f of the musical instrument or resonate with the casing f of the musical instrument. As a consequence, unnecessary resonated sounds will occur, resulting in a disadvantage in that good reproduced sounds are hard to be obtained.

OBJECT AND SUMMARY OF THE INVENTION

An object of the present invention is to provide a loudspeaker apparatus for an electronic keyboard musical instrument in which the above-described disadvantages of the conventional speaker apparatuses are eliminated and in which the low-frequency range characteristics are further improved.

According to a first aspect of the present invention, the foregoing and other objects are attained by a loudspeaker apparatus for an electronic keyboard musical instrument, the apparatus comprising a shelf board constituting a casing of the musical instrument. The shelf board has a sound emission opening and a first port. The apparatus further comprises a loudspeaker mounted on an upper side of the shelf board in alignment with a fringe of the sound emission opening, a first speaker box mounted on the upper side of the shelf board so as to enclose the loudspeaker and the first port, and a second speaker box mounted on a lower side of the shelf board in fluid flow communication with the first speaker box via the first port. The second speaker box has a second port.

Preferably, the loudspeaker apparatus further comprises a speaker horn which is provided on the lower side of the shelf board in alignment with the sound emission opening and which is formed by partly utilizing a side plate of the second speaker box.

According to the construction of the present invention, the sounds generated on the front side of the loudspeaker are emitted out of the sound emission opening provided in the shelf board. The sounds generated on the rear side of the loudspeaker are are shut off by the first speaker box. It follows that the sounds emitted from the loudspeaker are not subject to the effects of the casing of the musical instrument. Therefore, the low-frequency range characteristics are improved and good reproduced sounds can be obtained. In addition, since there are provided two speaker boxes and two ports such that they constitute a speaker system of double bass-reflex type, the low-frequency range characteristics are further improved. When the speaker horn is provided on the lower side of the shelf board in alignment with the sound emission opening by partly utilizing the side plate of the second speaker box, the sounds to be transmitted from the loudspeaker are prevented from being dispersed.

BRIEF DESCRIPTION OF THE DRAWINGS

The above and other objects and the attendant advantages of the present invention will become readily apparent by reference to the following detailed description when considered with the accompanying drawings wherein.

DETAILED DESCRIPTION OF THE INVENTION

An embodying example of the present invention will now be explained with reference to the accompanying drawings.

Figure 1:
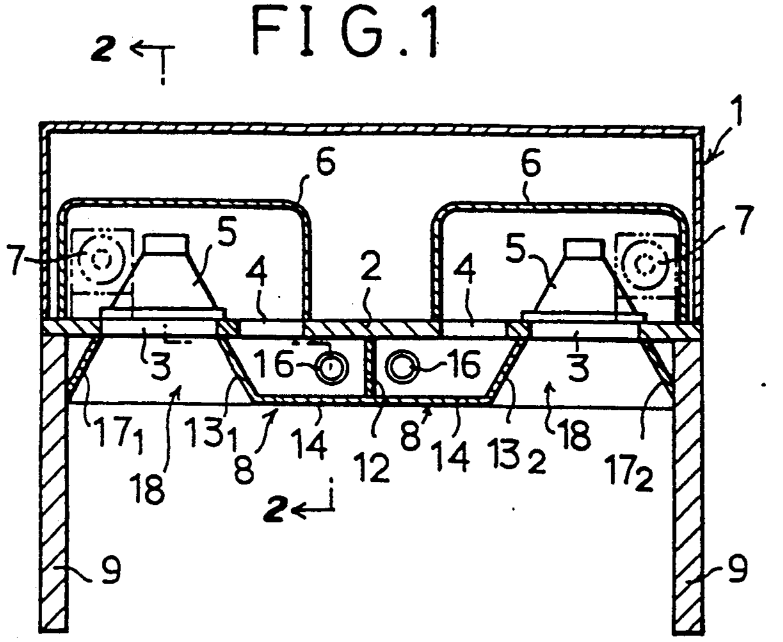
FIG. 1 is a sectional view, taken along the line I—I in FIG. 2, of one example of the present invention apparatus.
Figure 2:
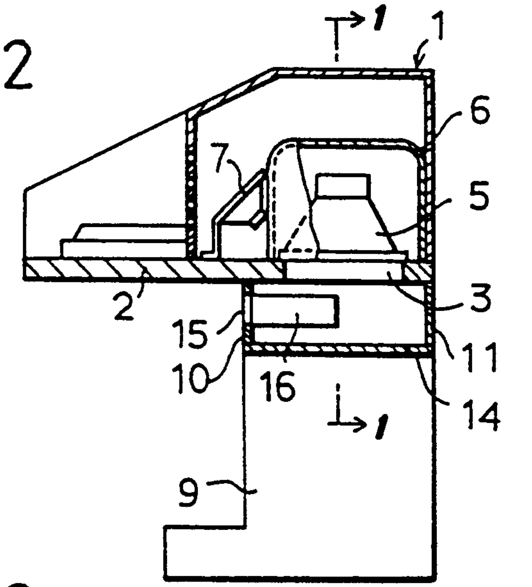
FIG. 2 is a sectional view taken along the line II—II in FIG. 1.
Figure 3:
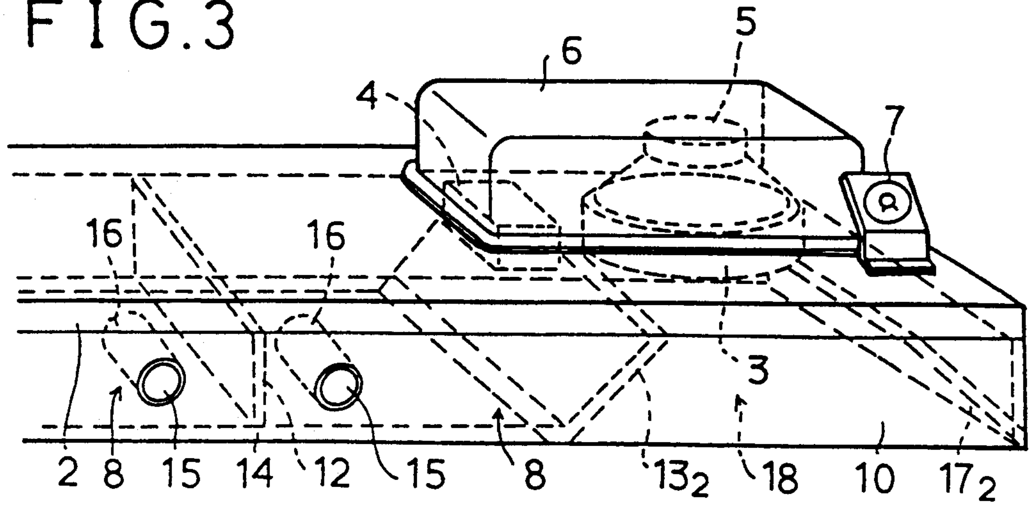
FIG. 3 is a perspective view of an important part of the above example.
Figure 4A:
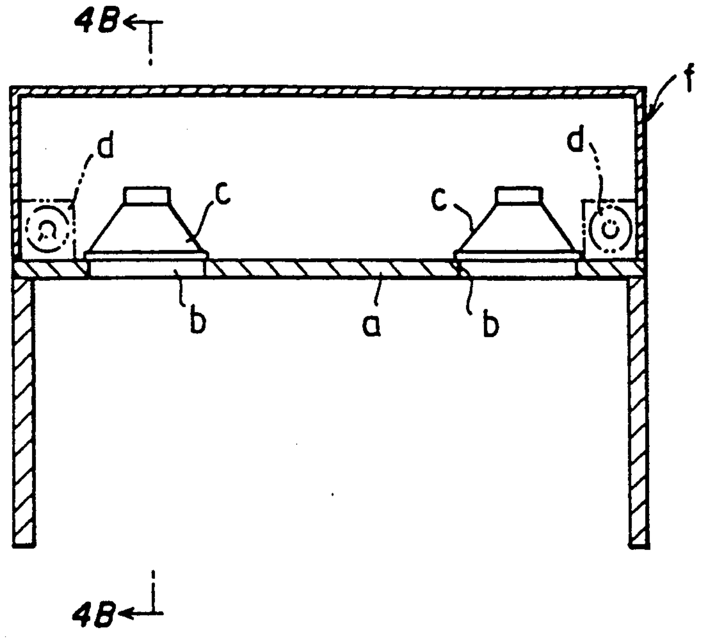
FIG. 4(A) PRIOR ART
FIG. 4(A) is a sectional view, taken along the line A—A in FIG. 4(B), of an example of a conventional apparatus
Figure 4B:
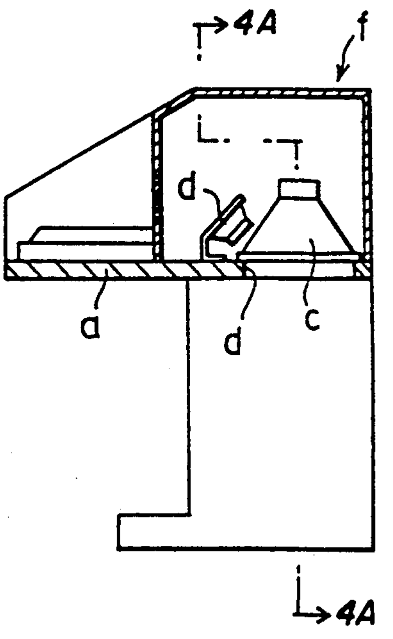
FIG. 4(B) PRIOR ART
FIG. 4(B) is a sectional view taken along the line B—B in FIG. 4(A) thereof.
Figure 5A:
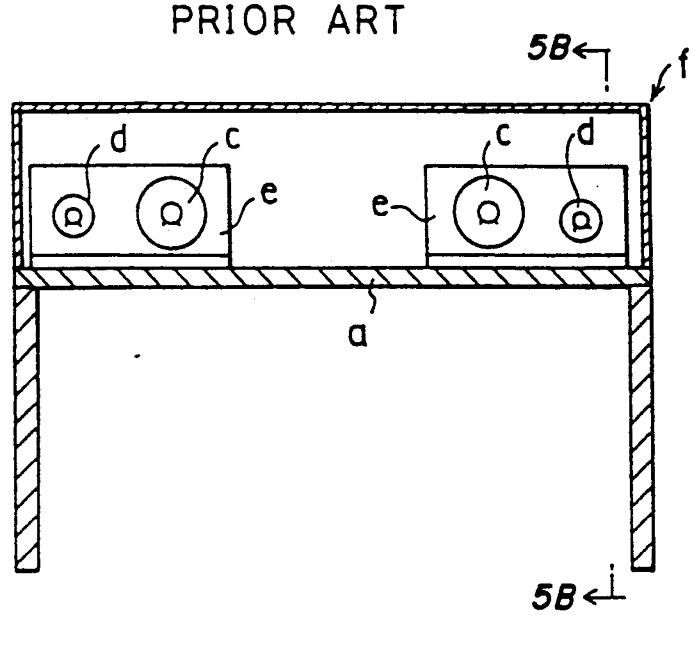
FIG. 5(A) PRIOR ART
FIG. 5(A) is a sectional view, taken along the line A—A in FIG. 5(B), of another example of a conventional apparatus
Figure 5B:
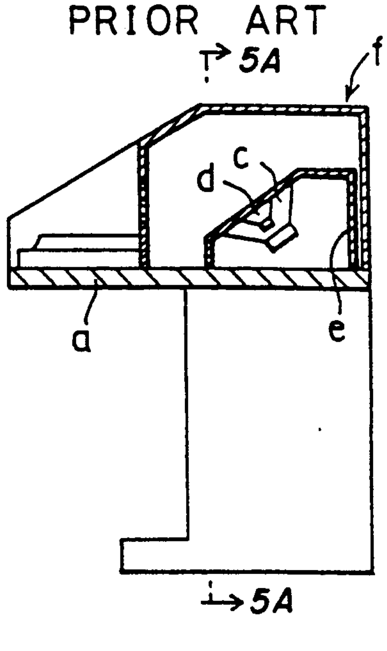
FIG. 5(B) PRIOR ART
FIG. 5(B) is a sectional view taken along the line B—B in FIG. 5(A) thereof.

Referring to FIG. 1 through FIG. 3, numeral 1 denotes a casing of an electronic keyboard musical instrument such, for example, as an electronic piano. Numeral 2 denotes a shelf board of the musical instrument casing 1. On the right and the left sides of the shelf board 2, there are respectively provided a sound emission opening 3 and a first port 4. In alignment with the fringe of each of the sound emission openings 3, 3, there is mounted, on the shelf plate 2, a loudspeaker 5 which is responsive to low and intermediate acoustic frequencies (e.g., a woofer). A speaker box 6 is mounted on the shelf board 2 such that it respectively encloses each set of the loudspeaker 5 and the port 4. Loudspeakers responsive to higher acoustic frequencies (e.g., tweeters) 7, 7 are mounted on the shelf board 2, each in close proximity to the respective right and the left speaker boxes 6, 6. On the lower side of the above-described shelf board 2, there are provided a pair of second speaker boxes 8, 8 each of which is respectively in fluid flow communication with each of the right and the left speaker boxes 6, 6 via each of the first ports 4, 4. Each of the pair of speaker boxes 8, 8 is made up of the shelf board 2, a front side-plate 10 and a rear side-plate 11 both of which extend up to the right and the left legs 9, 9 of the casing 1 of the musical instrument, a partition wall 12, the right and the left side-plates $\mathbf{13}_1$, $\mathbf{13}_2$, and the bottom plate 14. In the front side-plate 10 of the pair of the speaker boxes 8, 8, there is respectively formed a second port 15. A duct 16 is respectively mounted on the front side-plate 10 with one end of the duct being in alignment with the fringe of the second port 15. The above-described right and the left side-plates $\mathbf{13}_1$, $\mathbf{13}_2$ have an inclination as shown in FIG. 1. Each of the side plates $\mathbf{17}_1$, $\mathbf{17}_2$ which are provided, in an inclined manner, opposite to the above-described right and the left side-plates $\mathbf{13}_1$, $\mathbf{13}_2$ forms a loudspeaker horn 18 in cooperation with the above-described front side-plate 10 and the rear side-plate 11.

Figure 6:
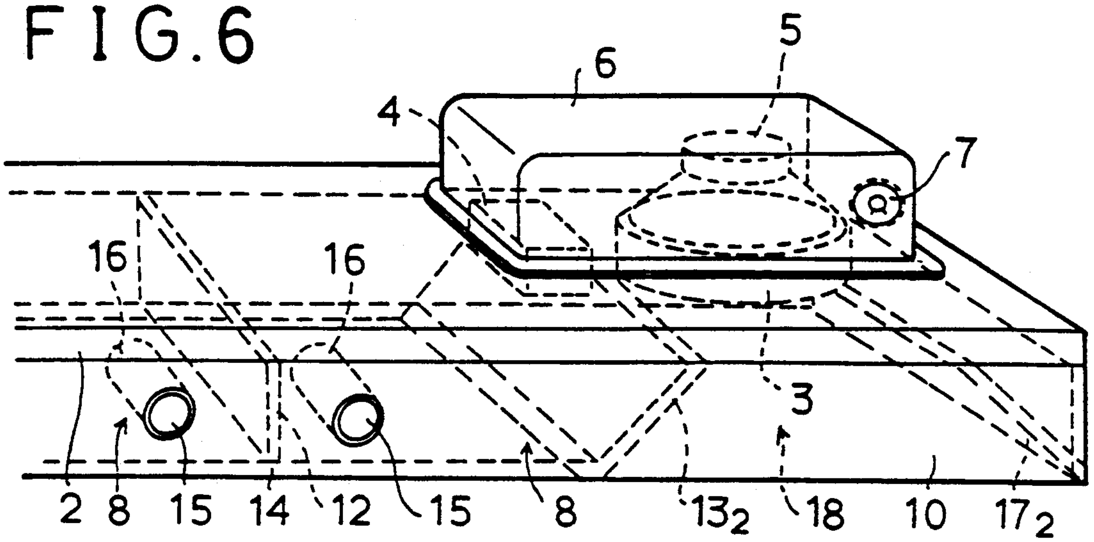
FIG. 6 shows another example of a conventional apparatus.

In the above-described example, the right and the left side-plates $\mathbf{13}_1$, $\mathbf{13}_2$ are inclined and the side plates $\mathbf{17}_1$, $\mathbf{17}_2$ are provided. However, instead of inclining the right and the left side-plates $\mathbf{13}_1$, $\mathbf{13}_2$, the leg plates 9, 9 of the instrument casing 1 may be used as a part of the loudspeaker horn 18, by deleting the side plates $\mathbf{17}_1$, $\mathbf{17}_2$. In addition, a loudspeaker responsive to higher acoustic frequencies 7 may be contained in each of the first speaker boxes 6, 6 by providing another sound emission opening as shown in FIG. 6 and mounting it in alignment with a fringe of the unillustrated sound emission opening.

Since the present invention has the above-described construction, it has an effect in that good sound reproducing characteristics are obtained and that the low-frequency range characteristics are improved.

It is readily apparent that the above-described loudspeaker apparatus for an electronic keyboard musical instrument meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A loudspeaker apparatus for an electronic keyboard musical instrument, said apparatus comprising:
   - a shelf board constituting a casing of said musical instrument, said shelf board having a sound emission opening and a first port, said sound emission opening communicating with an environment external of said casing;
   - a loudspeaker mounted on an upper side of said shelf board in alignment with a fringe of said sound emission opening;
   - a first speaker box mounted on the upper side of said shelf board so as to enclose said loudspeaker and said first port, said first speaker box being completely enclosed by said casing; and
   - a chamber mounted on a lower side of said shelf board in fluid flow communication with said first speaker box via said first port, said chamber having a second port, said second port communicating with the environment external of said casing.

2. A loudspeaker apparatus for an electronic keyboard musical instrument according to claim 1, wherein said loudspeaker, said first speaker box and said chamber constitute a first assembly, and wherein two said assemblies are provided respectively on right and left sides of said shelf board, and wherein the chambers of two said assemblies of two said assemblies are disposed to be adjacent to each other and to have one common side plate.

3. A loudspeaker apparatus for an electronic keyboard musical instrument according to claim 1, wherein said chamber is further provided with a duct inside thereof with one end of said duct being in abutment with said second port.

4. A loudspeaker apparatus for an electronic keyboard musical instrument according to claim 1, wherein said loudspeaker is one responsive to lower acoustic frequencies and wherein a second loudspeaker responsive to higher acoustic frequencies is provided on said shelf board outside and in proximity to said first speaker box.

5. A loudspeaker apparatus for an electronic keyboard musical instrument according to claim 1, wherein said first speaker box has another sound emission opening, wherein said loudspeaker is one responsive to lower acoustic frequencies, and wherein a second loudspeaker responsive to higher acoustic frequencies is provided on an inside of said first speaker box in alignment with said another sound emission opening.

6. A loudspeaker apparatus for an electronic keyboard musical instrument, said apparatus comprising:
   - a shelf board constituting a casing of said musical instrument, said shelf board having a sound emission opening and a first port;
   - a loudspeaker mounted on an upper side of said shelf board in alignment with a fringe of said sound emission opening;
   - a first speaker box mounted on the upper side of said shelf board so as to enclose said loudspeaker and said first port;
   - a chamber mounted on a lower side of said shelf board in fluid flow communication with said first speaker box via said first port, said chamber having a second port; and
   - further comprising a speaker horn which is provided on the lower side of said shelf board in alignment with said sound emission opening and which is partly formed by utilizing a side plate of said chamber.

7. A loudspeaker apparatus for an electronic keyboard musical instrument according to claim 3, wherein a leg plate of said casing of said musical instrument is partly utilized as a portion of said speaker horn which is located opposite to said side plate of said chamber.

8. A loudspeaker apparatus for an electronic keyboard musical instrument according to claim 3, wherein said second port comprises a tubular member communicating with an opening in a wall of chamber and extending only partially into said chamber.

9. A loudspeaker apparatus for an electronic keyboard musical instrument according to claim 3, further comprising a second loudspeaker disposed inside said casing and adjacent to said first speaker box.

* * * * *